(12) United States Patent
Heike Spieler Canne et al.

(10) Patent No.: US 12,068,544 B1
(45) Date of Patent: Aug. 20, 2024

(54) ELECTRICAL DEVICE CONDITION DETERMINING SENSOR AND METHOD

(71) Applicant: NOKOMIS, INC., Canonsburg, PA (US)

(72) Inventors: Karen Heike Spieler Canne, South Park, PA (US); Jennting Timothy Hsu, Bethel Park, PA (US); Vladimir Makarenko, McDonald, PA (US)

(73) Assignee: NOKOMIS, INC., Canonsburg, PA (US)

( * ) Notice: Subject to any disclaimer, the term of this patent is extended or adjusted under 35 U.S.C. 154(b) by 538 days.

(21) Appl. No.: 17/323,730

(22) Filed: May 18, 2021

(51) Int. Cl.
*H01Q 3/44* (2006.01)
*G01R 31/28* (2006.01)

(52) U.S. Cl.
CPC .......... *H01Q 3/44* (2013.01); *G01R 31/2846* (2013.01)

(58) Field of Classification Search
CPC .............................. H01Q 3/44; G01R 31/2846
USPC ........................................................ 702/183
See application file for complete search history.

(56) References Cited

U.S. PATENT DOCUMENTS

| | | | |
|---|---|---|---|
| 8,643,539 B2 | 2/2014 | Pauly et al. | |
| 8,818,745 B2 * | 8/2014 | Williams, Jr. | ......... G01R 31/62 |
| | | | 702/185 |
| 10,235,523 B1 | 3/2019 | Keller, III et al. | |
| 10,475,754 B2 | 10/2019 | Keller, III et al. | |
| 2009/0243876 A1 * | 10/2009 | Lilien | ...................... H02G 1/02 |
| | | | 340/870.01 |
| 2017/0245361 A1 | 8/2017 | Keller et al. | |
| 2018/0313877 A1 * | 11/2018 | Brant | ..................... G01R 23/02 |
| 2021/0123775 A1 * | 4/2021 | Kiesel | ..................... G01L 1/246 |

OTHER PUBLICATIONS

Liangjun Xie, Nong Gu, Dalong Li, Zhigiang Cao, Min Tan, Saeid Nahavandi "Concurrent control chart patterns recognition with singular spectrum analysis and support vector machine"; Computers & Industrial Engineering; vol. 64, Issue 1, Jan. 2013, pp. 280-289.
A.M. Tome, D. Malafaia, A.R. Teixeira, E.W. Lang; "On the use of Singular Spectrum Analysis"; arXiv:1807.10679v1 [22ss.SP] Jul. 27, 2018.

* cited by examiner

*Primary Examiner* — John H Le
(74) *Attorney, Agent, or Firm* — AP Patents; Alexander Pokot

(57) ABSTRACT

A sensor configured to determine a condition of an electrical device may include an antenna, a receiver and a controller designed to implement a method. The method of determining a condition of an electrical device may include selecting a plurality of singular dimensional components of a multi-dimensional signal of a radio frequency (RF) emission from an electrical device, extracting singular dimensional components individually or as a combination, inputting each individual extracted singular dimensional component or the combination of the components into a neural network (NN), and analyzing, with NN, outputs from the inputted singular dimensional component (s). Singular-spectrum analysis (SSA) and/or wavelet transform may be used to select components.

21 Claims, 13 Drawing Sheets

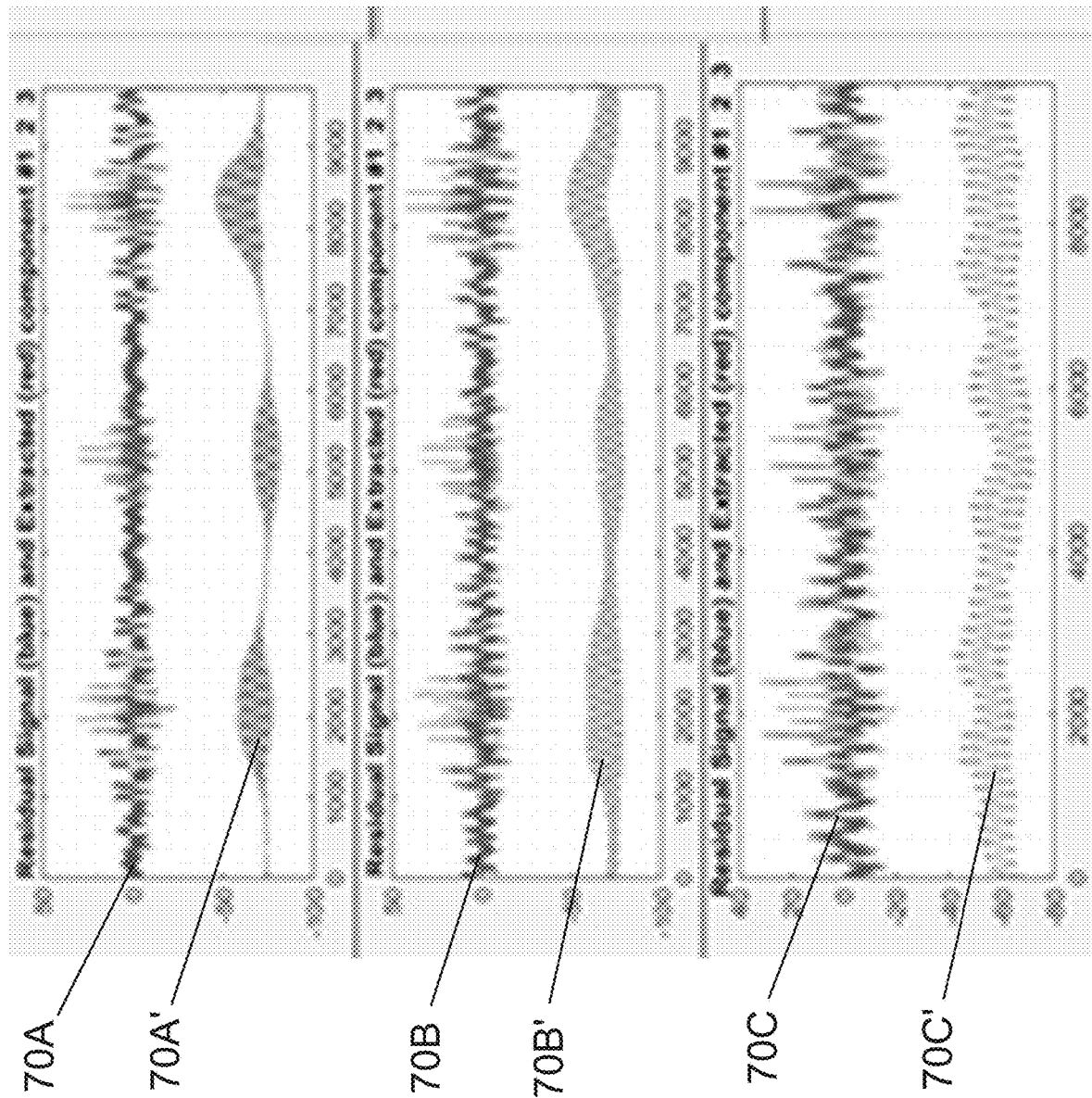

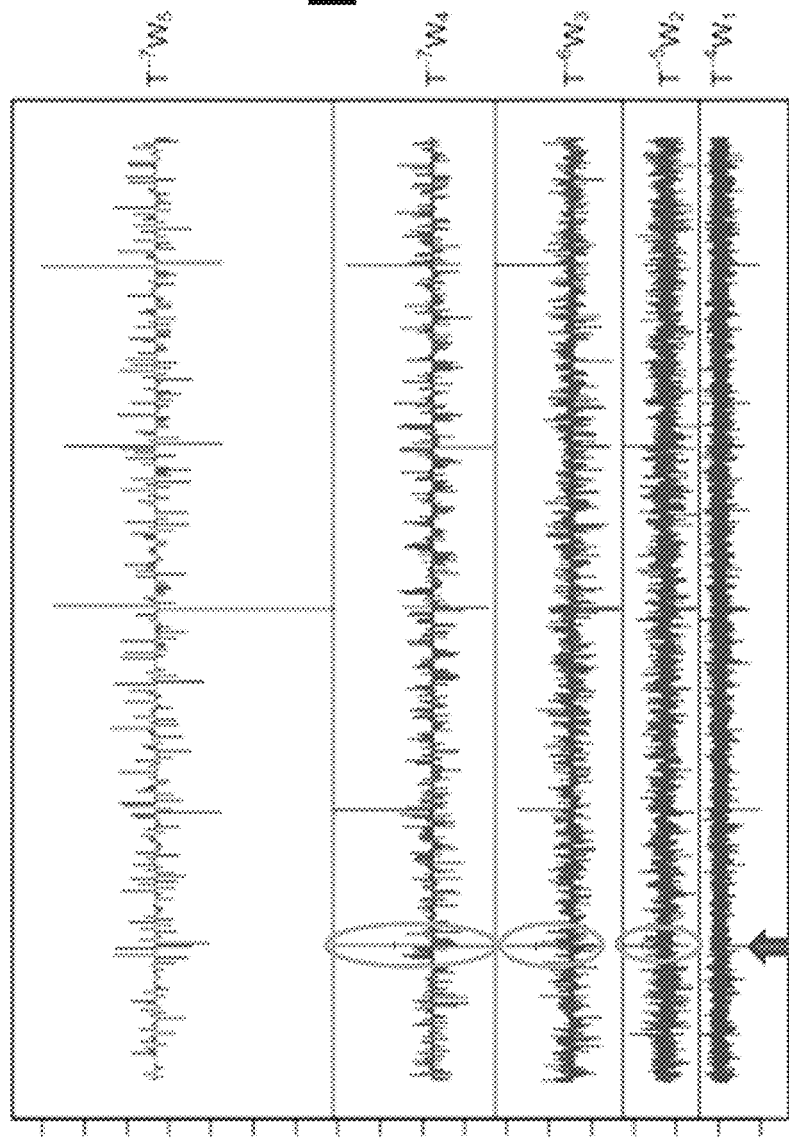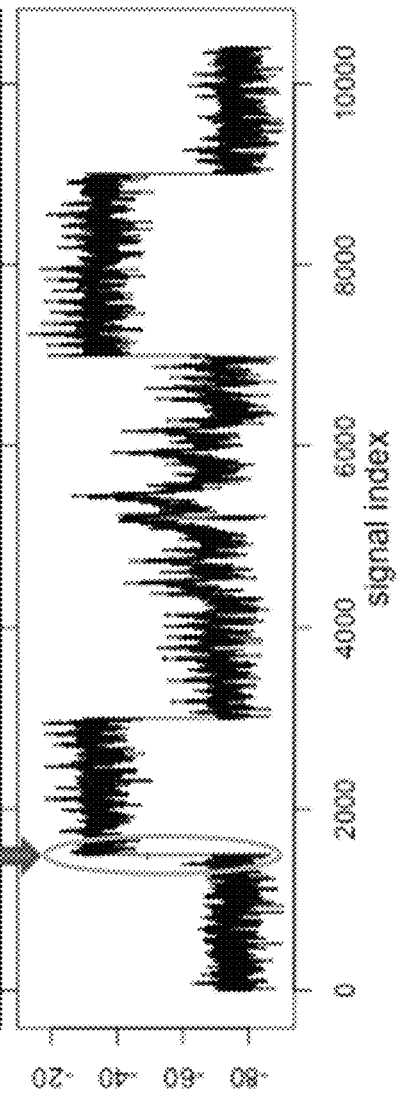

ELECTRICAL DEVICE CONDITION DETERMINING SENSOR AND METHOD

CROSS-REFERENCE TO RELATED APPLICATIONS

N/A

STATEMENT REGARDING FEDERALLY SPONSORED RESEARCH AND DEVELOPMENT

N/A REFERENCE TO SEQUENCE LISTING, A TABLE, OR A COMPUTER PROGRAM LISTING COMPACT DISC APPENDIX

N/A

TECHNICAL FIELD

The subject matter relates to health monitoring of electronic device. The subject matter may be related to determination of remaining useful life of electronic device. The subject matter may be related to using neural networks to determine remaining useful life of electronic device based on processing of digital representation of emitted electromagnetic energy in a radio frequency range of the spectra.

BRIEF DESCRIPTION OF THE DRAWINGS

The accompanying drawings are incorporated in and constitute part of the specification and illustrate various embodiments. In the drawings:

FIGS. 6A-6C illustrate application of a singular-spectrum analysis (SSA) to decompose components of the RF emission signal;

FIGS. 8A-8B illustrate an illustration of wavelet transformation;

DETAILED DESCRIPTION

Figure 1:
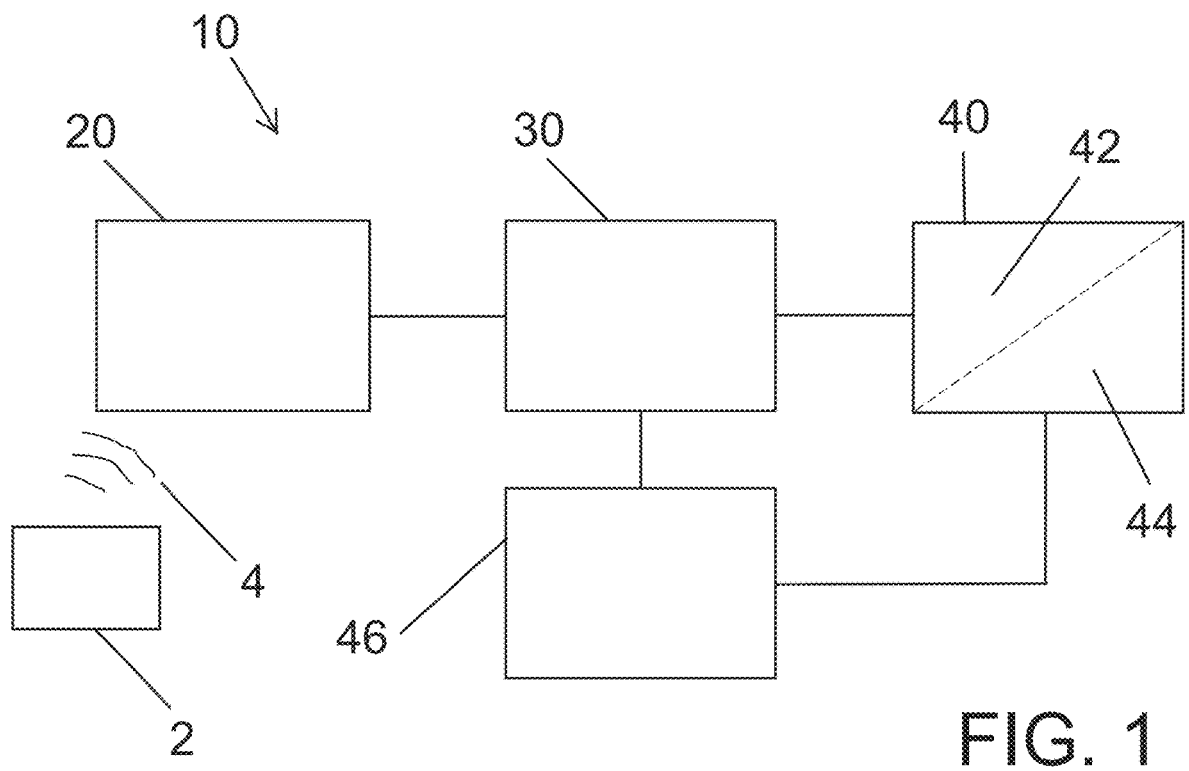
FIG. 1 illustrates a block diagram of a sensor.

Prior to proceeding to the more detailed description of the present subject matter, it should be noted that, for the sake of clarity and understanding, identical components which have identical functions have been identified with identical reference numerals throughout the several views illustrated in the drawing figures.

Features which are described in the context of separate embodiments may also be provided in combination in a single embodiment. Conversely, various features which are, for brevity, described in the context of a single embodiment, may also be provided separately or in any suitable subcombination. The Applicant hereby gives notice that new Claims may be formulated to such features and/or combinations of such features during the prosecution of the present Application or of any further Application derived therefrom.

It is to be understood that the singular forms "a," "an," and "the" include plural referents unless the context clearly dictates otherwise or expressly specified otherwise. Thus, for example, reference to "a component surface" includes reference to one or more of such surfaces.

For purposes here, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives.

For purposes here, the words "comprising," "including," "having," and variants thereof, wherever they appear, shall be construed as open-ended terminology, with the same meaning as if the phrase "at least" were appended after each instance thereof. The verb "may" is used to designate optionality/noncompulsoriness. In other words, something that "may" can, but need not.

Before elucidating the subject matter shown in the Figures, the present disclosure will be first described in general terms.

Safety and reliability of electrical devices may be crucial in many applications. Safety and reliability of electrical devices may be crucial to the success of an autonomous mission, as failure of a single device can lead to a catastrophic failure or cripple mission objectives. This is especially true of systems in which a fault or failure can rapidly lead to an unsafe state.

Electrical device may be a single electronic device, for example such as a semiconductor device. Electrical device may be an assembly of semiconductor devices. Electrical device may be a complex equipment or system employing various electrical and non-electrical components. Such complex equipment may be an electric motor. Such complex equipment may be an airplane. Such complex equipment may be an aeronautical vehicle. Every powered electrical device emits electromagnetic energy, even when the electrical device is powered but is not tasked to perform a function. Most, if not all electrical devices, emit electromagnetic energy in a radio-frequency (RF) range of the spectra. Electrical device may have abrupt changes in RF emissions when under a stress state. Digital electronics have tolerances in signal integrity that allow them to continue operating after degradation occurs, as long as "high" or "low" threshold conditions are met, the shape of the signal, or even the noise associated with it do not come into play. However, these changes are indicative of device degradation which can rapidly lead to device faults if not detected and subsequently corrected. Device degradation may be also referred to as device aging.

Health monitoring of the electrical device may be used to determine degradation and/or aging of the electrical device. Remaining useful life (RUL) may be a feature measured and/or determined during health monitoring based on monitoring of RF emission from the electrical device to quantify a level of degradation and/or aging.

In every device and/or system, each component has a unique emissions signature, whose quantifiable metrics are directly associated with the functional state of the device. In a non-limiting example, currents within the electrical device circuitry generate radiated electromagnetic signatures in the RF range, hereinafter referred to RF emission. Characteristics of such generated RF emission provide insight as to the condition of the electrical device itself, as circuit degradation causally relates to signature features. The radiated RF emission is generally unique to the layout, condition, and functionality of the circuitry and acts as a unique signature of the current status for the electrical device. Overall energy of the RF emission spectrum features changes over time, particularly for stressed components. In view of the above, any transient high stress event which can affect the ongoing health and safety of the system can be identified. Accordingly, corrective actions may be implemented to prevent system failure or unsafe conditions.

As initial effects of aging may not result in out-right failures in many instances, that may be typically referred to as single event upsets (SEUs), systems that experience intermittent issues without identification of the root cause may be prone to sudden catastrophic failure due to the accumulated degradation of electronics.

Disclosed herein is a sensor that is designed to receive intended and/or unintended RF emission (signal), process and analyze signature of such intended and/or unintended RF emission. Unintended emission of electromagnetic energy may be related to a condition where the electrical device is powered but is not tasked or controlled to perform a function. Unintended emission may be a by-product of how the electrical device is designed. Unintended emission may be related to emissions that that are not used for the intended purpose of the electrical device. In a non-limiting example, an electrical device such as motor is not designed to emit electromagnetic energy, yet the electromagnetic energy radiates from the electrical motor. In a non-limiting example, a clock source is designed to send, over a wire, a clock signal to another component within the electrical device, yet the electromagnetic energy radiating from the wire is not intended to be used during operation of the electrical device. Even when the electrical device is designed to emit electromagnetic energy at a specific frequency range, an emission at a frequency which is outside of this range may be considered as an unintended emission. The sensor may be further designed to determine and output a condition of the electrical device. The condition may be a stress level of the electrical device. The condition may be the RUL. The sensor may be designed to determine RUL at the device level. The sensor may be designed to determine RUL at the subcomponent level.

The sensor may comprise an antenna configured to capture RF emission in a form of a signal, a receiver configured to receive and convert the captured RF emission signal into a digital format and a controller configured to analyze the digital signal.

The antenna may be one of a monopole antenna, a dipole antenna, a yagi antenna, a dish antenna, a horn antenna, a log periodic antenna, a loop antennas, off-center fed dipole (OCFD) antenna, a spiral antenna, a coil antenna, and any combination thereof.

The receiver is at least designed with a port suitable to electrically couple or connect the receiver to the antenna and input the captured RF emission signal. The antenna port may be provided as a connector. The connector may be any one of SMA connector, BNC connector, N-type connector, SMB connector, and MCX connector. The receiver may be designed with a sensitivity of −170 decibel (dB). The receiver may be designed with a sensitivity of −165 dB. Such receiver may be capable of not only capturing low level emissions only a few dB above the theoretical thermal noise floor of −174 dB (at room temperature), but also resolving very fine characteristic frequency features to 1 Hz Resolution Bandwidth (RBW), thus offering capability of beyond 1 billion separate data points selected from the first 100 MHz alone.

The controller may be constructed of any electrical component, or group of electrical components, that are capable of carrying out the functions described herein. The controller may be designed as a microprocessor controller with a processor and a memory, which is a non-transitory signal, the memory having executable program instructions stored thereon (for example as a computer-readable medium) that when executed by the processor cause the processor to perform analysis of a digital representation of the RF emission signal in accordance with analysis method (s) described below. The executable program instructions, which executed via the processor of the controller, create means for implementing the functions/acts specified in the flowchart and/or block diagram block or blocks.

The controller may include any one microcontroller, field programmable gate arrays, systems on a chip, volatile or nonvolatile memory, discrete circuitry, and/or other hardware, software, or firmware that is capable of carrying out the functions described herein, as would be known to one of ordinary skill in the art. Such components may be physically configured in any suitable manner, such as by mounting them to one or more circuit boards, or arranging them in other manners, whether combined into a single unit or distributed across multiple units. The instructions followed by controller in carrying out the functions described herein, as well as the data necessary for carrying out these functions, are stored in a memory.

The controller may be disposed remotely from the antenna and receiver. In a non-limiting example, the antenna and/or the receiver may be position adjacent the electrical device and the receiver may be designed to wirelessly communicate with a remote controller that may be a computer designed and programmed to execute specific computer program instructions on the set of RE spectra data. In other words, the controller may be provided as a purpose executing special computer executing computer program instructions.

These computer program instructions may be stored in a computer readable medium that can direct the computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Computer program code for carrying out operations for aspects of various embodiments may be written in any combination of one or more programming languages, including an object oriented programming language, such as Java, Smalltalk, C++, or the like, and conventional procedural programming languages, such as the "C" programming language or similar programming languages. In accordance with various implementations, the program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The computer-readable medium can be encoded with a computer program, so that execution of that program by one or more computers causes the one or more computers to perform one or more of the methods disclosed herein. Suitable media can include temporary or permanent storage or replaceable media, such as network-based or Internet-based or otherwise distributed storage of software modules that operate together, RAM, ROM, CD ROM, CD-R, CD-R/W, DVD ROM, DVD.+−. R, DVD.+−.R/W, hard drives, thumb drives, flash memory, optical media, magnetic media, semiconductor media, or any future storage alternatives. Such media can also be used for databases recording the information described below.

Many of the elements described herein may be implemented as modules. A module may be defined here as an isolatable element that performs a defined function and has a defined interface to other elements. The modules described in this disclosure may be implemented in hardware, software in combination with hardware, firmware, wetware (i.e hardware with a biological element) or a combination thereof, all of which are behaviorally equivalent. For example, modules may be implemented as a software routine written in a computer language configured to be executed by a hardware machine (such as C, C++, Fortran, Java, Basic, Matlab or the like) or a modeling/simulation program such as Simulink, Stateflow, GNU Octave, Ansoft Maxwell, HFSS, GEMACS, SuperNEC 1.53, MATHCAD, R or Lab VIEWMathScript. Additionally, it may be possible to implement modules using physical hardware that incorporates discrete or programmable analog, digital and/or quantum hardware. Examples of programmable hardware comprise: computers, microcontrollers, microprocessors, application-specific integrated circuits (ASICs); field programmable gate arrays (FPGAs); and complex programmable logic devices (CPLDs). Computers, microcontrollers and microprocessors are programmed using languages such as assembly, C, C++ or the like. FPGAs, ASICs and CPLDs are often programmed using hardware description languages (HDL) such as VHSIC hardware description language (VHDL) or Verilog that configure connections between internal hardware modules with lesser functionality on a programmable device. Finally, it needs to be emphasized that the above mentioned technologies are often used in combination to achieve the result of a functional module.

The sensor may be designed to be installed within the electrical device. The sensor may be designed to be installed adjacent the electrical device. The sensor may be designed to be installed at a distance from the electrical device. A strength of the RF emission signal may decrease in a relationship to a sensor position at a distance therefrom then a sensor positioned in a proximity to the electrical device. In any of the above installations, the sensor may be referred to as a health monitor. In any of the above installations, the sensor may be referred to as a fault monitor and manager. In any of the above installations, the sensor may exploit RF emissions that necessarily emanate from the functioning electrical devices. In any of the above installations, the sensor may be designed to unobtrusively monitor the electronic health of the critical systems in real-time. In any of the above installations, the sensor may be designed to identify stress states before they lead to system or component failure. The autonomous nature of the sensor may provide a means to address trends towards unsafe states without relying on operator or crew response. The autonomous nature of the sensor may provide a clear indicator of risk conditions.

When the frequency domain spectrum data is processed via algorithms to quantify changes in radiated RF emission, the RF emission signal extracted by analysis algorithms may differentiate between safe and stressed system states. Any change to system status, such as changes in hardware configuration or functionality, or software implementation alters a waveform of the RF emission signal. The changes may be automatically detected and analyzed.

The signature characteristics of the RF emission signal is generally related to the circuit operation of the emission source. The complex nature of the time domain RF signal is broken down and observed as discrete spectral features. The nature of these spectral features is therefore highly dependent on the circuit's operation that may be reflected in its alternating current (AC) signal. The more complex the AC signal, the more highly specific detailed frequency components comprise the resulting RF signal. A subtle change in the shape of the complex waveform can result in a significant change to multiple metrics of frequency domain signatures. A change in operation status, processing procedure, memory allocation, or programming, leads to changes in how these electrical devices send and receive signals as well as the shapes of the electrical signals. Frequency components may be also manifested by the direct current (DC) signal.

As it has been said above, received RF emission signal, in its raw form, is a complex signal including a combination of various signature characteristics and further including noise. To streamline processing of RF emission signal, at least in a reduction of a processing time, a method of determining a condition of electrical device may use a machine learning (ML) algorithm. The ML algorithm may be related to supervised learning. The ML algorithm may be related to unsupervised learning. The ML algorithm may include density-based spatial clustering of applications with noise (DBSCAN) that is designed to separate effectively clusters of data with different data density. The ML algorithm may include a support vector machine (SVM) that is designed to predict which category a particular data belongs to, based on training set examples, to reduce signal complexity. The machine learning may include application of a neural network (NN). NN may be selected as a supervised deep learning NN (DLNN) to predict which category a particular data belongs to, based on training set examples.

The ML algorithm may include an artificial neural network (ANN). ANN is a data-driven approach and defines characteristics through its training method, which makes it possible to analyze and classify environments in congested situations. ANN optimizes its artificial neurons through a myriad of training datasets to establish a fast and robust AI unit. The data contains a rich and diverse set of characteristic signatures for persistent monitoring and diagnosis. To achieve the most sensitive, accurate and reliable results, as much of this information as possible should be included in the analysis. ANN is effective at combining large and incongruent information into easily understood quantities. It allows the use of multiple techniques in conjunction, ultimately utilizing all relevant information to distinguish one unique signature from another.

The ML algorithm may include a convolution neural network (CNN). CNN consists of several different layers stacked together in a deep architecture: an input layer, a group of convolutional and pooling layers, a group of fully connected hidden layers, and an output layer. A convolutional layer introduces a special way of organizing hidden units that aims to take advantage of the local structure present in the input data. The weights of such a hidden unit create a convolutional kernel (filter) which is applied to (tiled over) the whole input space, resulting in a feature map. This way, one set of weights can be reused for the whole input space. This is based on the premise that locally useful features will also be useful in other places of the input space (i.e., signal or image space)—a mechanism which not only vastly reduces the number of parameters to estimate, but improves robustness to translational shifts of the data. Dimensionality reduction can be achieved through pooling layers that perform downsampling to merge adjacent cells of a feature map.

There are several optimization methods that may be applied for CNN parameter estimation. One optimization method may include a mean square error (MSE) method. This is achieved by minimizing the loss between the newly acquired dataset and the training dataset. Given a set of training dataset {Xi} and newly acquired dataset {Yi}, the loss function, denoted by L((Θ)), can be formulated as follows:

$$L(\Theta) = \frac{1}{n}\sum_{i=1}^{n}\|F(Y_i; \Theta) - X_i\|^2, \qquad (1)$$

where n is the number of training samples.

Another optimization method that may be considered is the Gradient Descent (GD). GD performs optimization and is by far the most common way to optimize neural networks. At the same time, every state-of-the-art Deep Learning library contains implementations of various algorithms to optimize gradient descent. There are three variants of GD, which differ in how much data to use to compute the gradient of the objective function. These variants include a batch gradient descent, a stochastic gradient descent, and a mini-batch gradient descent.

There are several numerical evaluation metrics/methods that can be used to assess the performance of the RF emission signal processing techniques when the true signal characteristics are available. The metric may include one of a peak signal-to-noise Ratio (PSNR), a mean squared error (MSE), a structure similarity index (SSIM), a multi-scale SSIM, an information fidelity criterion, a spectral angle mapper (SAM), and any combinations thereof.

The PSNR may be used for quantitatively evaluating restored image quality, and is at least partially related to the perceptual quality. The proposed signal processing process is not bound by one specific evaluation metric. All of the four aforementioned metrics will be used to assess the performance of the signal processing process. The performance evaluation metrics may be developed based on accuracy of RF based defect identification and/or accuracy of RF based defect characterization.

Logistic sigmoids and hyperbolic tangents may be used as typical non-linear activation functions in a multilayer perceptron. Recent implementations of deep architectures have unequivocally replaced them with alternative solutions. One of the most common is the application of rectified linear unit (ReLu), which use the following activation function:

$$f(x)=\max(0,x) \qquad (2)$$

ReLu has several advantages over traditional units: faster computation and more efficient gradient propagation, biological plausibility (one-sidedness) and sparse activation structure, while still retaining sufficient discriminatory properties despite their simplicity.

Application of algorithm may include an the ML autocorrelation to enhance signal source. The input RF emission signal may be enhanced so that the sources of interest can be made to stand out. Autocorrelation is a cross-correlation of a signal sequence with itself. It may be capable of extracting repetitive patterns from random time series data. Autocorrelation may be used to enhance the characteristics of target signals such as submarines in low signal-to-noise ratio (SNR) environments. This characteristic of autocorrelation is useful for monitoring submarine generators that produces normal regular signal patterns and for discerning any abnormalities in these regular patterns.

Thus, according to the characteristics of autocorrelation, the autocorrelation technique may be valuable to extract useful features for submarine detection and positioning.

The ML algorithm may include application of a singular-spectrum analysis (SSA), a time series analysis incorporating the elements of classical time series analysis, multivariate statistics, multivariate geometry, dynamical systems, and signal processing to reduce complexity of the RF emission signal. For SSA analysis, components are numerated by the *eigenvalue* which corresponds to them. The largest eigenvalue provides component #1, the second largest component #2, etc. The enumeration of the components is done according to their contribution to the original signal—from the largest to the smallest: 1, 2, ..., n. Component extraction is specified their number, a single one e.g. #5, or to group several of them e.g. 1, 2, and 6. Many probabilistic and statistical elements may be employed in the SSA-based methods (they relate to stationarity, ergodicity, principal component and bootstrap techniques). Application of SSA extracts the most heavily weighted components. However, SSA is not a statistical method in terms of classical statistics. In particular, SSA typically does not make any statistical assumptions concerning either signal or noise while performing the analysis and investigating the properties of the ML algorithms. Multiple components filtered by SSA may be combined prior to inputting into the NN. SSA may be referred to as a component domain.

The ML algorithm may include application of wavelet transform to select spectra components and reduce complexity of the received RF emission signal.

Reduction of the complexity of the RF emission signal may be referred to as filtering components of the RF emission signal. Reduction of the complexity of the RF emission signal may be referred to as breaking down the RF emission signal into its components. Reduction of the complexity of the RF emission signal may be referred to as decomposing the RF emission signal into its components.

ML algorithm may be used to isolate RF emission signal source. Wavelet transform may be used to isolate RF emission signal source, by a local maximum detection, to characterize abrupt changes in the RF emission signal. Wavelet transform may include Daubechies wavelets. Wavelet transform may include Biorthogonal wavelets. Some wavelets have symmetry characteristics and some wavelets have compact support properties. Wavelet transform may include identification of the optimal resolution level to isolate RF signal source.

The wavelet process is a multi-resolution process. In the multi-resolution process, the input data and their transforms are tightly connected through the extracted features. In addition, the magnitudes of the identified features in multiple resolution spaces are less than the magnitudes in the original input data, which will shorten the processing speed.

Wavelet analysis stands out from multi-resolution analysis techniques due to its capability to capture the time-varying changes on time series data. The detail coefficients of wavelet decomposition reflect the magnitude changes of the time series data. The wavelet multi-resolution mechanism decomposes the time series data (into multiple resolution spaces to jointly characterize the magnitude changes in the data. The magnitudes of the detail coefficients (i.e., wavelet coefficients) at each resolution space ($W_1$ or $W_2$ or $W_3$ or $W_4$ or $W_5$) are extracted. Because at each resolution space the mean of the wavelet coefficients is zero, the magnitude changes can be better characterized without affecting unleveled magnitudes along the data. Wavelet transform may be referred to as a subspace domain.

To train the NN, data may be collected during different operating and fault states of the electrical device. The targets data sets may include samples to be used for baseline metrics as well as samples which will be subjected to different conditions to induce aging, stress, and near failures. The target data sets may be selected to ensure sufficient representative subsystems and components to test general wear and aging, degradation due to stress events, and identification of unsafe states. RF emission signature components after filtering may be used as a training data set to train NN. RF emission signature components after filtering may be further used as an input data set to be processed by a trained model.

RF signature features (or parameters) from the target data sets may be ranked, in terms of criticality, to allow prioritization of reactions to unsafe and critical states and to provide immediate action while still collecting and assessing other signature features to determine upcoming maintenance and replacement schedules.

Analysis may begin with identification and extraction of quantitative parameters describing features of the RF emission signature, being represented in its digital form.

The complex nature of the time domain RF signal is broken down and observed as discrete spectral features whose details are highly dependent on the circuit's operation reflected in its internal changes in current patterns over time. A subtle change may result in a significant change to multiple metrics of frequency domain signatures.

In view of the above, input data set may be obtained by capturing unintended RF emission during intended operation of the electrical device. In a non-limiting example, data from propulsion equipment may be captured during craft flying. Unintended RF emissions may be also obtained by accelerating aging of the electrical device in a temperature controlled chamber. A vibration may be also introduced during testing. In other words, an expected data set of RF emission parameters may be modeled with accelerated testing.

The number of RF emission signature parameters (features for example such as amplitude, different frequencies, shapes, etc) may vary in accordance with a type of device. For each identified RF emission signature parameter of interest, quantitative values may be determined. If accelerated aging is used, for each RF emission signature parameter a probability density function (PDF) may be calculated to define a relationship between each RF emission signature parameter and a duration of time aged using a two dimensional kernel algorithm. The two dimensional kernel may be a Gaussian kernel when the shape is symmetrical.

The individual parameter likelihood functions may be combined multiplicatively to form an overall likelihood function that describes the probabilistic relationship between measured emission parameters and device age. The overall likelihood function may be peak-like in shape. The peak location may correspond to the likeliest device age, while the Full Width at Half Maximum (FWHM) of the peak may indicate prognostic uncertainty. Inclusion of additional parameters may reduce the FWHM and sharpen the likelihood peak, directly reducing prognostic uncertainty. Inclusion of additional measurements in defining the PDFs from which likelihood functions are derived affects the accuracy.

Specific signature features or markers may be identified and ranked to establish a correlation with condition of the electrical device. New or changing markers may be also identified and may be used to update remaining system stress level and system safety levels. The changes that occur during stress and fault incidences may be analyzed for use in a creation of automated phenomenological algorithms for the estimation of device condition, health levels and/or a threat level. These changes in spectral characteristics of the electrical device and/or its components due to degradation may be utilized to allow for identification of component age and reliability. The individual parameter likelihood functions may be combined multiplicatively to form an overall likelihood function that describes the probabilistic relationship between measured emission parameters and device age.

Machine learning algorithms may be then trained to identify different RF emission markers indicative to changes related to elevated stress and fault states.

Outputs from two machine learning algorithms may be compared with each other to verify analyzed RF emission signal. In a non-limiting example, a wavelet transform analysis may be used to verify results from the SSA. In a non-limiting example, SSA may be used to verify results from the wavelet transform.

A method of determining the condition of electrical device may combine spectral quantification metrics and the machine learning algorithm(s). With spectral quantification metrics, at least one signature characteristic of the unintended RF emission signal is to be measured. The RF emission signature characteristic may include one or more of the frequency shift (absolute), frequency shift (relative to fundamental), a non-linear mixing products appearance, disappearance, and/or relative amplitude envelope change, changes in total emission energy, changes in emitted energy distribution symmetry and information content (Shannon Entropy), a total emitted energy over a defined spectral band, and a total emitted information content (energy state distribution) over a defined spectral band.

A set of the RF emission signature characteristics may define the target data set. A set of filtered RF emission signature characteristics may define an input data set.

Statistical validation of the selected spectra components may be carried out by determining the Mahalanobis Distance (MD) between the selected components. MD determines a distance between a given point and a given "reference" distribution. The "reference" distribution may be a spectrum of an idle state of the electrical device. Averaged MD over all points of other spectrum introduces a threshold separating different states of the electrical component.

The above apparatus method may be applicable for use in unmanned vehicles to provide a safety system to identify any threats to vehicle performance and mission. The real-time threat analysis system may enhance vehicle safety without a need for an operator to either identify issues or initiate measures to compensate for unsafe operating states. In this application, a subsystem failure is the leading cause of mission failure due to platform loss. The ability to identify fault prone conditions prior to failure allows for platform retention.

The above described apparatus method may provide validated tools, technologies, and techniques for automated detection, diagnosis and prognosis that enable mitigation of adverse events during flight as relates to NASA's Integrated Vehicle Health Management (IVHM). The above apparatus method may provide validated tools, technologies, and techniques for automated detection, diagnosis and prognosis that enable mitigation of adverse events during flight as related to NASA's Exploration Systems Mission Directorate (ESMD). The cause of most adverse situations is system, subsystem, or component faults or failure which are caused by damage degradation, or environmental hazards that occur during flight. The rapid and accurate prediction or diagnosis of the cause of system failure using the above described apparatus method may allow maintenance workers, crew, adaptive configuration systems, and other control System to take preventative action to ensure the safety of the aircraft. The above described apparatus method may provide better tools and methods to ensure safe launch, flight, and mission operation of the many components of the overall Constellation and Exploration architecture. The above described apparatus method may provide better monitoring and diagnosis capabilities while minimizing sensor mass and volume requirements.

An ability to diagnose health and/or predict the RUL of the electronic systems within an electric propulsion aircraft may enable safer and more accurate flight testing as well as new predictive regimens of motor drive maintenance. Specifically, this approach may make flight testing newly developed systems, ranging from spacecraft propulsion components to electric propulsion aircraft components, safer and with more acuity and with higher certainty of detecting potentially dangerous failure conditions long before they materialize. Faster launch or deployment of propulsion systems control or associated electromechanical components may provide costs savings in the proactive maintenance of space or aerospace propulsion or control components.

The above apparatus and method provide for distinguishing the RF emission signal of interest of the propulsion equipment from background noise in challenging conditions due to the extremely noisy launch and flight environments.

Existing highly specific traditional mechanical, electrical, ultrasound, laser, x-ray and radiological tests refined over decades of manned flight may not be well suited for detecting anomalies in real-time propulsion equipment.

Changes in RF emission signal may be related to changes in vibration levels. The vibration levels may be associated with operation of motors within the propulsion equipment.

The sensor, as described above, may be mounted in a close proximity to the motor. In other words, the propulsion equipment may be designed with the sensor, as described above. The motor may be subjected to vibration during operation where the vibration changes characteristics (signature) of the RF emission signal. Accordingly, the sensor may acquire an RF emission signal that is representative of propulsion vibration.

In a propulsion application, the sensor may be designed to capture or acquire near field RF signals reflecting vibration with the antenna and to transmit this signal to the receiver for signature identification, extraction, and classification. The sensor may be designed based on the characterization effectiveness representative propulsion vibration signal and corresponding RF signal acquisition.

In a propulsion application, the sensor and method provide propulsion monitoring and/or fault detection.

Propulsion equipment may be designed as turbine-engine-driven generator. Propulsion equipment may be designed with electric-motor-driven fans.

Vibration and RF emission signals may be simultaneously recorded during evaluation of the representative propulsion and RF communication environment. Optimal locations for placement of near-field or far-field antennas, including antenna size and coaxial cable routing may be also determined. RF emission and vibration data may be taken before activation, as motors ramp up to speed, during nominal operation, during shut-off and slow down, and for an inactive period afterwards. A minimum of 5 sets of RF emission and vibration data may be taken for each vibration source, and a minimum of 3 vibration sources may be selected. A follow-up of 10 more sets of data may be allocated and taken based on the analyzed results. RF emission and vibration data analysis start and stop may be synchronized. The data sets may be analyzed RF signature identification, isolation, and correlation between vibration signatures and RF signatures at subsequent tasks.

A quality of the vibration signal as reflected in the captured RF emission may be defined prior to RF emission analysis. This may be used to characterize the environment signals (echoes, reverberation, noises). The quality criterion may be then used to give a confidence index to the user for the different results of the detection step, based on 2 opposite methods: the use of signal descriptors from the detected signal (duration, onset, sustained part, fundamental, harmonics . . . ) and the use of mathematical representations (Mel-frequency cepstral coefficients, wavelet). Different noisy conditions (rain, traffic, knocking on the sensors) were detected, and this dataset allowed us to adjust our method.

Background noise may be generated from analogous propulsion equipment or simulation software.

Acquired signal data sets may be used as reference data sets and testing data sets for further signal processing validation and algorithm testing.

The sensor and method(s), as described above, provide for distinguishing the RF emission signal of interest from guidance electronics, control relay systems, and on-board surveillance equipment (sensors and cameras).

The sensor and method (s), as described above, may be used to improve safety of an autonomous vehicle. Such autonomous vehicle may be a drone. The drone may be used in different applications including but not being limited to law enforcement, surveying and mapping, precision agriculture, media and entertainment, education, retail, and commercial delivery.

The sensor and method (s), as described above, may be used to improve safety a self-driving vehicle, which also requires health monitoring for critical failures.

The sensor and method (s), as described above, may be used in semiconductor and banking industries, commercial and military avionics manufacturers and operators, automotive, satellite, and medical device manufacturers, telecommunication providers.

The sensor and method (s), as described above, may be used for monitoring health of a turbogenerator to deliver high fuel efficiency.

The sensor and method (s), as described above, may be used for monitoring health of multiple fans within the aircraft that introduce a plurality of failure points.

The sensor, as described above, may be a modular sensor that may be mounted remotely from the electrical device or integrated into the structure thereof to monitor the electrical device in real-time to perform multi-node abnormality detection and identification. The sensor may be used to identify problems, reduce risk and/or provide data for future design improvements. This sensor may be used for thermal, structural, and acoustic measurement of systems and subsystems while also providing emergency system halt instructions in the case of leaks, fire, or structural failure.

The sensor, as described above, may be used to identify condition of the semiconductor components such as Insulated Gate Bipolar Transistor (IGBT) or Metal-Oxide-Semiconductor Field-Effect Transistor (MOSFET) drivers. These components may be used to rapidly switch high currents to stationary motor windings. The components generate complex phenomena for determining degradation and progression of several possible failure mechanical and electrical modes, including motor winding insulation breakdown. Electrical 'noise' or Electromagnetic Interference (EMI), in other words, unintended RF emissions generated within the interactions of drive circuitry, motor mechanical response and electrical winding characteristics offer unique signals indicative of the state of the propulsion system from deep within, and are conducted by 'skin effect' to be radiated as RF energy into surrounding space. Motor winding degradation and resulting inter-winding capacitance changes alter the complex emissions throughout the spectrum of RF frequencies and well above 100 MHz. Typical motor conditions detected with EMI diagnostics may include stator coil partial discharge, deterioration in slots and on end, winding contamination (dirt, oil, carbon black), bearing problems, misalignment, and shaft oil seal rub. Very low levels of arcing can be detected by high frequency analysis of a wide band antenna signal (and magnetic field probe) using a matched filter model. A single measured variable (RF signal) is sufficient to characterize the degrees of arcing in the DC motor.

The sensor may be also provided as a system-on-a-chip, where the antenna, receiver and controller are mounted onto a semiconductor substrate, encapsulated and adapted with leads for mounting onto a circuit board or with a connector for a plug-in connection into a mating connector.

The sensor and method(s), as described above, enable autonomous monitoring of the system and subsystem health to identify possible critical failures or unsafe states that may prevent operational failure.

The sensor and method(s), as described above, enable monitoring electronics with no a priori knowledge, after the NN has been trained, to detect meaningful variations from RF emissions baseline indicative of critical states.

The sensor and method(s), as described above, enable identification of metrics in variation to categorize threat level and failure cause.

The sensor and method (s), as described above, enable development of algorithm to autonomously detect and categorize differences between RF emissions data.

The sensor and method (s), as described above, enable utilization of fault emissions data to test ability of algorithm to differentiate between routine and noteworthy deviations in emissions.

The sensor and method (s), as described above, enable implementation of automated marker assessment for different electronics and electrical devices.

The sensor and method (s), as described above, simplify identification of a root cause of the high stress and/or an abnormal operational problem.

The sensor and method(s), as described above, enable a discrimination of critical system faults from changes in emissions that are related to background changes, normal changes in system operational states, or expect normal wear. This may allow for a more efficient and direct reaction to critical states and may further allow for countermeasures to protect the system prior to system failure.

Now in a reference to the drawings.

FIG. 1 illustrates a block diagram of a sensor 10 that is designed with an antenna 20, a receiver 30, a controller 40 and a power source 46. The antenna 20 captures a raw emission 4 of the electromagnetic energy from an electrical device 2 in the radio frequency (RF) range. This raw emission will be referred to as an RF emission signal. The receiver 30 is electrically coupled to the antenna 20. The receiver 30 receives the RF emission signal from the antenna 20 and processes the RF emission signal in accordance with the disclosure of FIG. 2. The controller 40 is electrically coupled to the receiver 30. The controller 40 analyzes a digital representation of the processed RF emission signal. The controller 40 is illustrated as at least including a processor 42 and a memory or storage 44. The above components may be mounted on a single printed circuit board (not shown). Each of the antenna 20, the receiver 30 and the controller 40 may be mounted in separate locations from each other. In a non-limiting example, the antenna 20 may be mounted in a proximity to the electrical device 2 being monitored so as to receive near field emissions 4, while the receiver 30 and the controller 40 may be mounted remotely from the electrical device 2. In a non-limiting example, the antenna 20 and the receiver 30 may be mounted in a proximity to the electrical device 2 being monitored, while the controller 40 may be mounted remotely from the electrical device 2.

Figure 2:
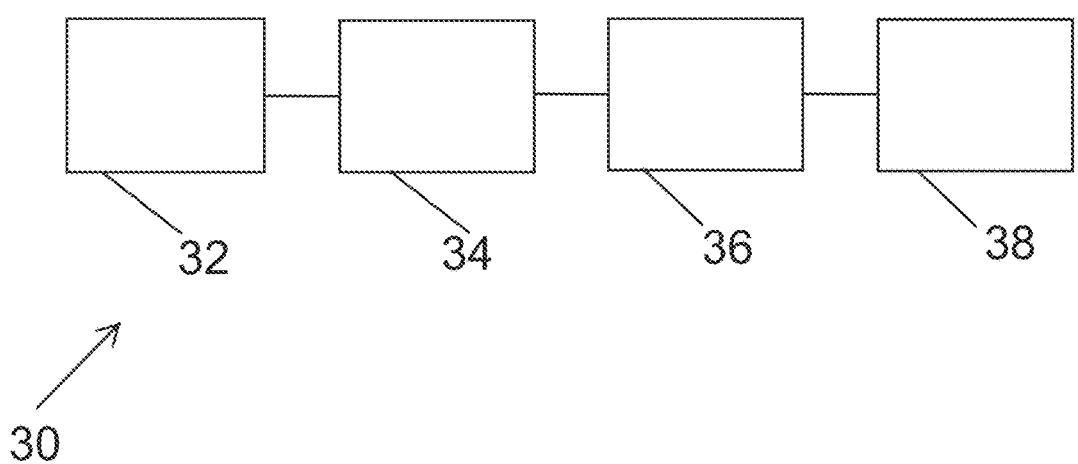
FIG. 2 illustrates a block diagram of a receiver of FIG. 1.

FIG. 2 illustrates a block diagram of the receiver 20 designed with a low noise amplifier (LNA) 32, a splitter 34, a tuner 36 and analog-to-digital (ADC) converter 38.

Figure 3:
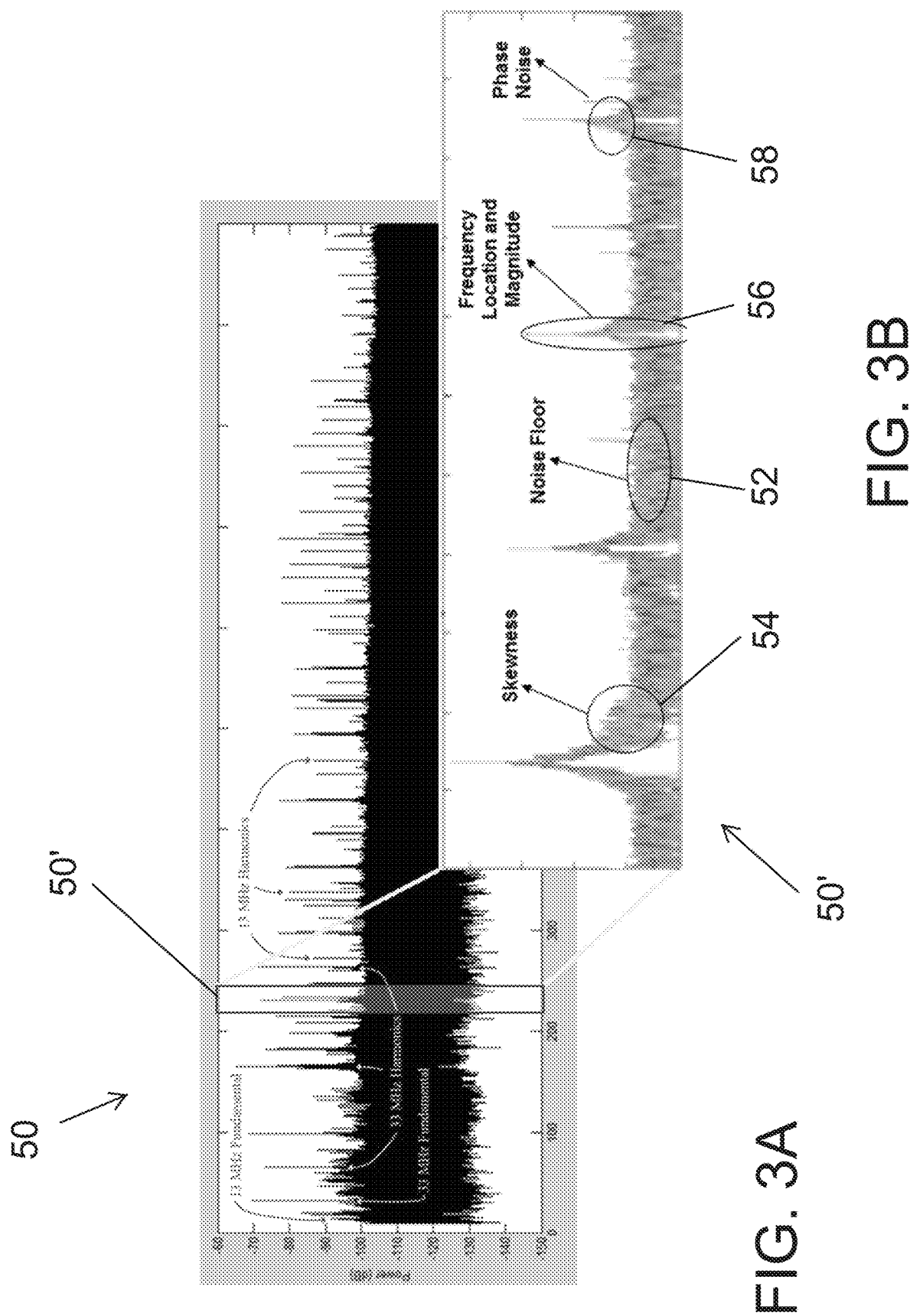
FIG. 3A illustrates a waveform of an electromagnetic emission in a radio frequency range (RF) that may be received and processed by the sensor.
FIG. 3B illustrates features of the waveform of FIG. 3A.

FIG. 3A illustrates a waveform 50 of an electromagnetic emission in a radio frequency range (RF) that may be received and processed by the sensor 10.

FIG. 3B illustrates an exemplary region 50' of the RF emission signal 50 of FIG. 3A. The RF emission signal 50 may be a waveform. The exemplary region 50' is illustrated as defining selected features (characteristics) of the RF emission signal that may be used for characterizing electrical device, such as a noise floor 52, a skewness 54 a frequency location and magnitude (power) 56 and phase noise 58.

Figure 4:
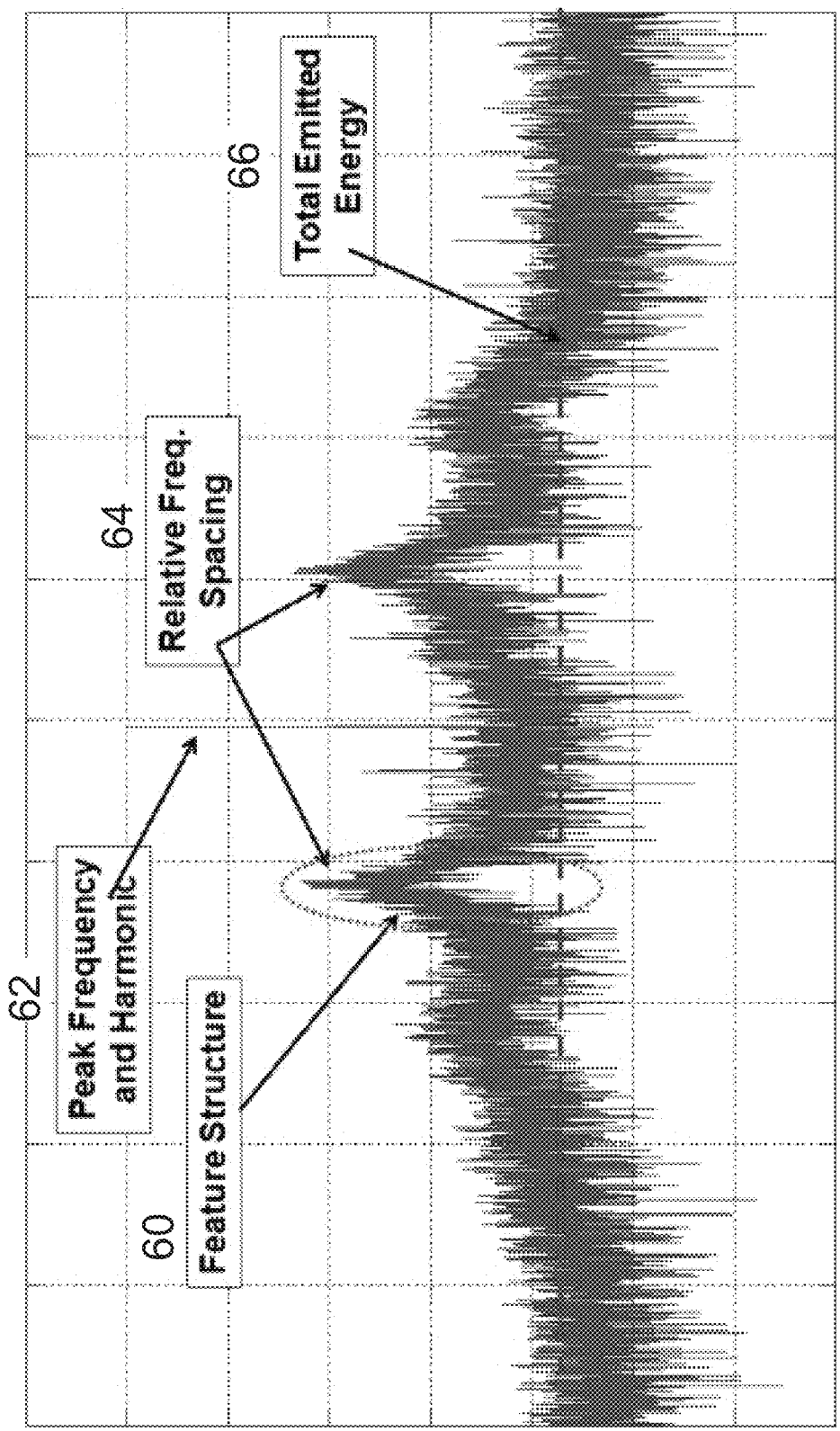
FIG. 4 illustrates additional features of the waveform of FIG. 3A.

FIG. 4 illustrates additional features of the waveform 50 of FIG. 3A, particularly showing a feature structure 60, a peak frequency 62, a relative frequency spacing 64 and a total emitted energy 66.

Figure 5:
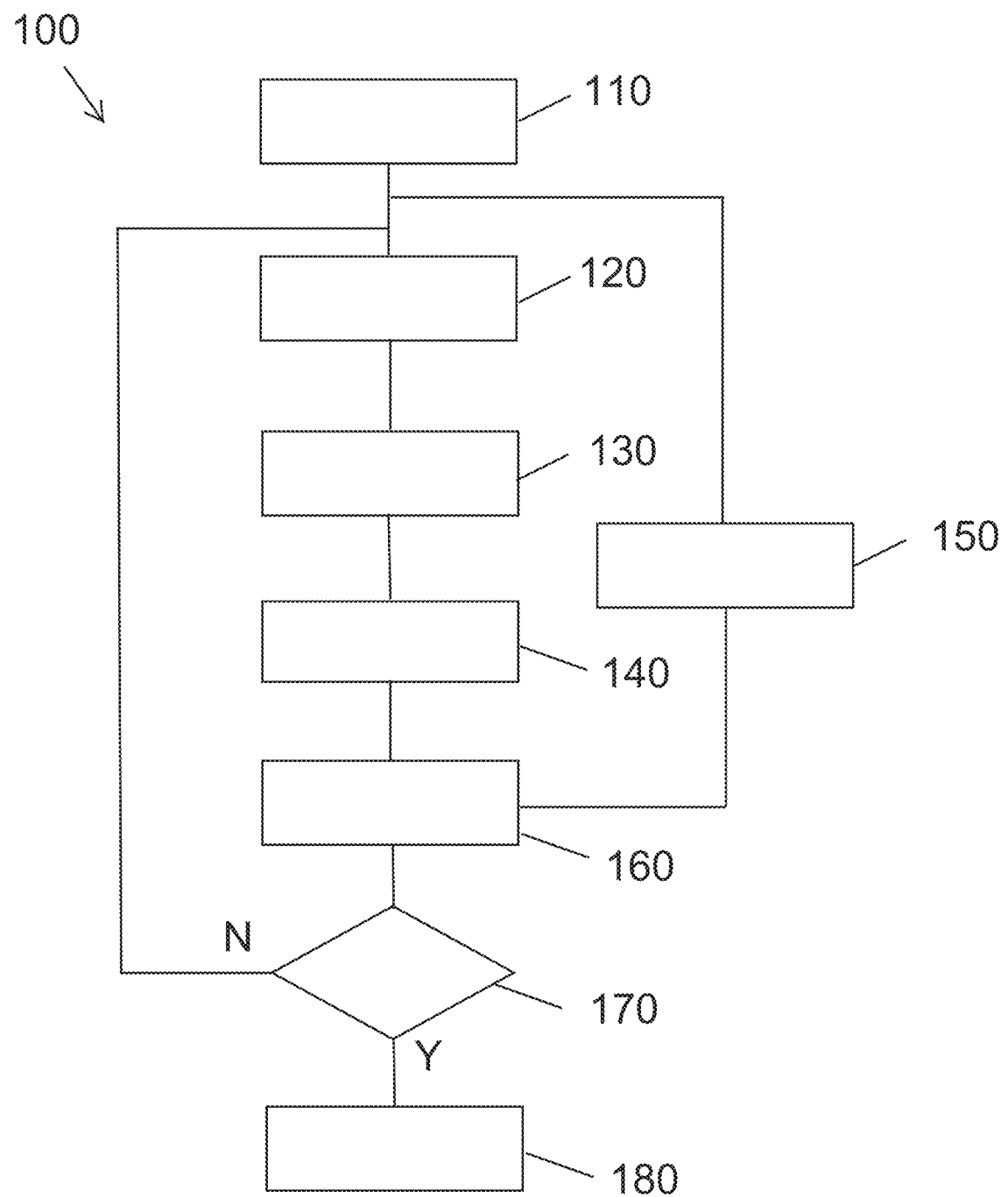
FIG. 5 illustrates a flow chart of an exemplary method to train a neural network (NN) to process received RF emission.

FIG. 5 illustrates a flow chart of an exemplary method 100 to train a neural network (NN) to process received RF emission signal. The method may 100 begin with receiving and processing a raw RF emission signal by the antenna 20 and the receiver 30 at 110. A digital representation of the raw RF emission signal may be inputted into the controller 40 from a file. RF emission signature features of interest in the RF emission signal may be filtered by the controller 40 at 120. Filtering of the RF emission signature features may be referred to as extracting RF emission signature features. Filtering of the RF emission signature features may be referred to as breaking-down the RF emission signal. RF emission signal may be filtered using the SSA. RF emission signal may be filtered using a wavelet transform. The controller 40 is further programmed to use filtered components, as a training data set, to train a neural network (NN) at 130 and output a trained model. The controller 40 may validate the trained model at 160 by a comparison with an independent spectral analysis at 150. The independent analysis may be performed within the controller 40 based on the received data or may be inputted into the controller 40. The spectral analysis may be achieved by applying a Mahalanobis distance (MD) metric. The validation may be also performed by using a different filtering model. In a non-limiting example, filtering with SSA may be validated by filtering with a wavelet transform. If controller 40 validates the trained model at 170, the trained model is outputted and stored within memory 44 at 180. If the trained model is not validated at 170, then the training method repeats by selecting different component (s) for SSA or a different template (filter) for wavelet transform at 120.

FIGS. 6A-6C illustrate results of decomposing RF emission signal with SSA to extract components of the waveform. Horizontal axis denotes frequency and vertical axis denotes amplitude or signal strength in decibel (dB). FIGS. 6A-6C illustrate different power modes/states of the electrical device 2. FIG. 6A may illustrate an idle state of the electrical device 2 where 70A represents the waveform and 70A' represents an orthogonal projection of selected components of the waveform 70A. FIG. 6B may illustrate an intermediate power level state of the electrical device where 70B represents the waveform and 70B' represents an orthogonal projection of selected components of the waveform 70B. FIG. 6C may illustrate stressed state level of the electrical device where 70C represents the waveform and 70C' represents an orthogonal projection of selected components of the waveform 70C. Clearly, the extracted components reflect clearly quantitative differences in unintended RF emission of various modes of power. FIGS. 6A-6C further illustrate the selected components as a combination (group or sum) of three largest components (components 1, 2, 3) broken down or filtered by SSA. The modes, represented by 70A', 70B' and 70C' can be analyzed by various metrics to determine the difference between states. Metrics may include one of a cross-correlation, a mutual information, a Mahalanobis distance and any combinations thereof.

Figure 7A:
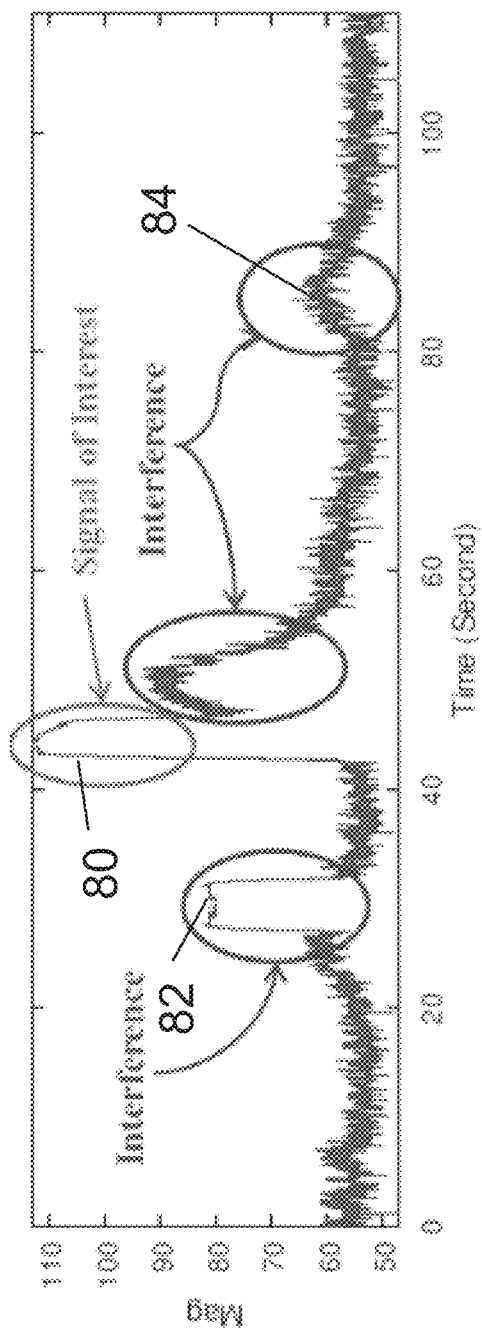
FIG. 7A-7B illustrate application of a wavelet transform to filter RF emission signal by denoising.
Figure 7B:
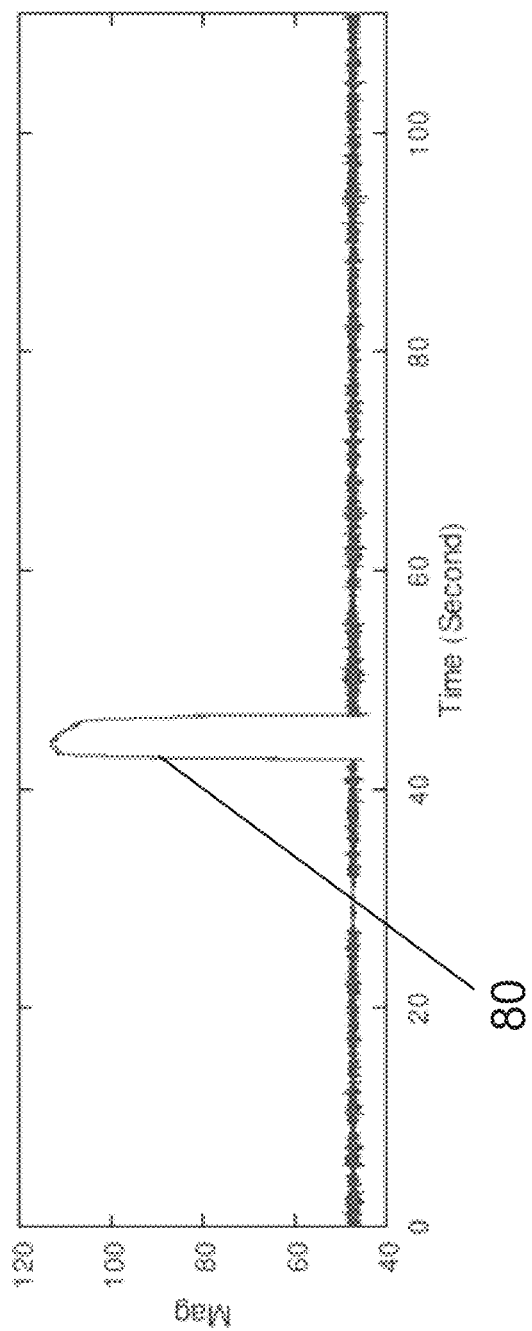

FIG. 7A-7B illustrate application of a wavelet transform to denoise RF emission signal. FIG. 7A illustrates the signal 80 of interest buried within the signal noise or interferences 82 and/or 84. FIG. 7B illustrates a denoised signal 80.

FIGS. 8A-SB illustrate an illustration of wavelet multi-resolution RF emission signal decomposition (transformation). FIG. 8A illustrates an original time series data. FIG. 8B illustrates decomposition of the time series data of FIG. 8A into multiple resolution spaces to jointly characterize the magnitude changes in the data in R environment where Wn defines wavelet coefficients at a resolution level n.

Figure 9:
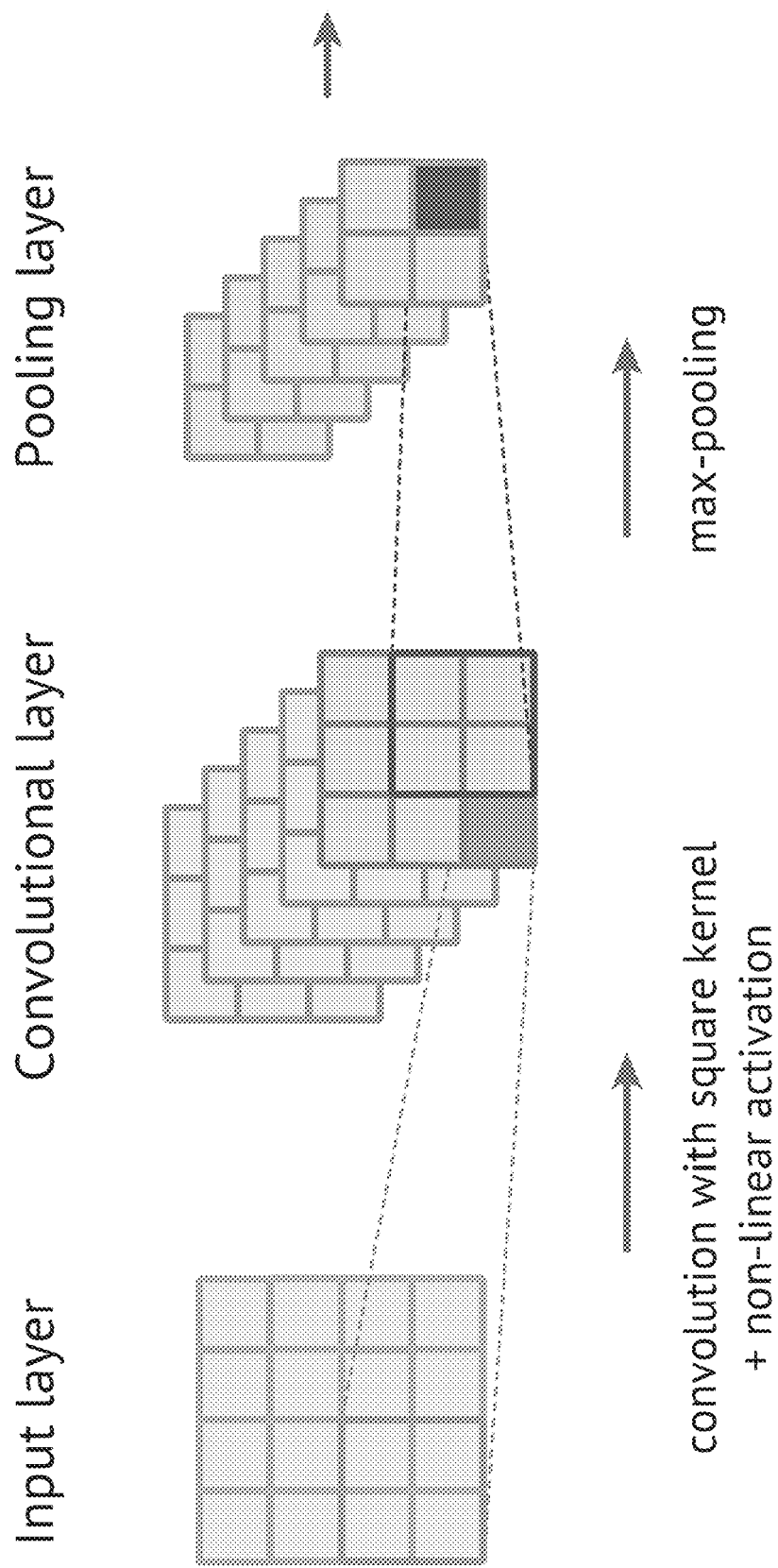
FIG. 9 illustrates a schematic diagram of a convolution-pooling operation performed by a neural network (CNN) on an input data.
Figure 10:
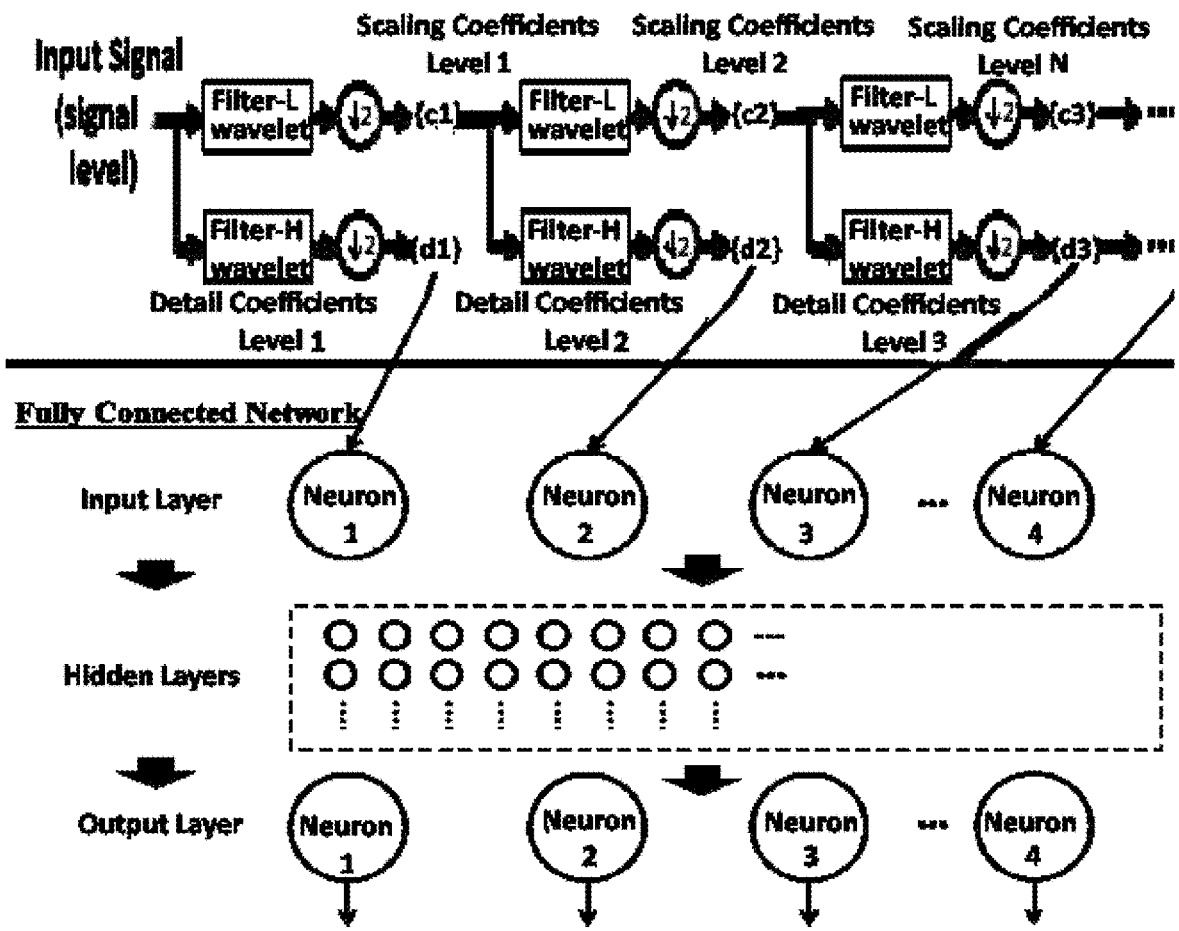
FIG. 10 illustration of filter bank based wavelet decomposition scheme for CNN's convolution and pooling process and a structure of a fully connected network (NN) process.
Figure 11A:
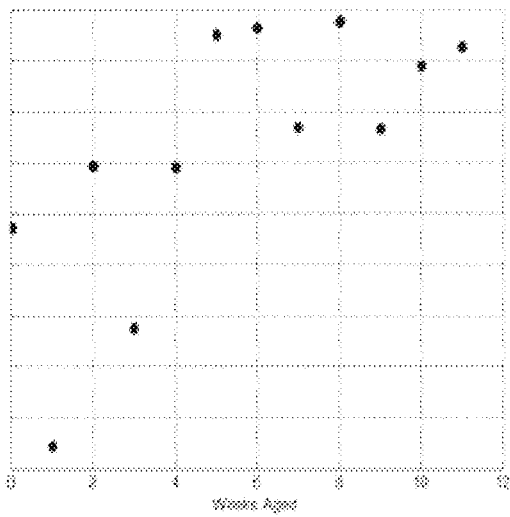
FIGS. 11A-11B illustrates application of a probability density function (PDF) to the RF emission signal.
Figure 11B:
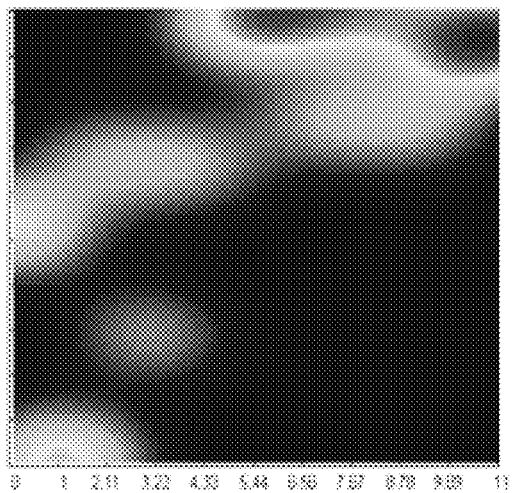

FIG. 9 illustrates a schematic diagram of a convolution-pooling operation performed by a neural network (CNN) on an input data;

FIG. 10 illustration of filter bank based wavelet decomposition scheme for CNN's convolution and pooling process and a structure of a fully connected network (NN) process;

FIG. 11B illustrates application of a probability density function (PDF) to the parameter scatter plot of FIG. 11A, using a kernel algorithm. The kernel may be a Gaussian kernel when the shape is symmetrical.

Figure 12:
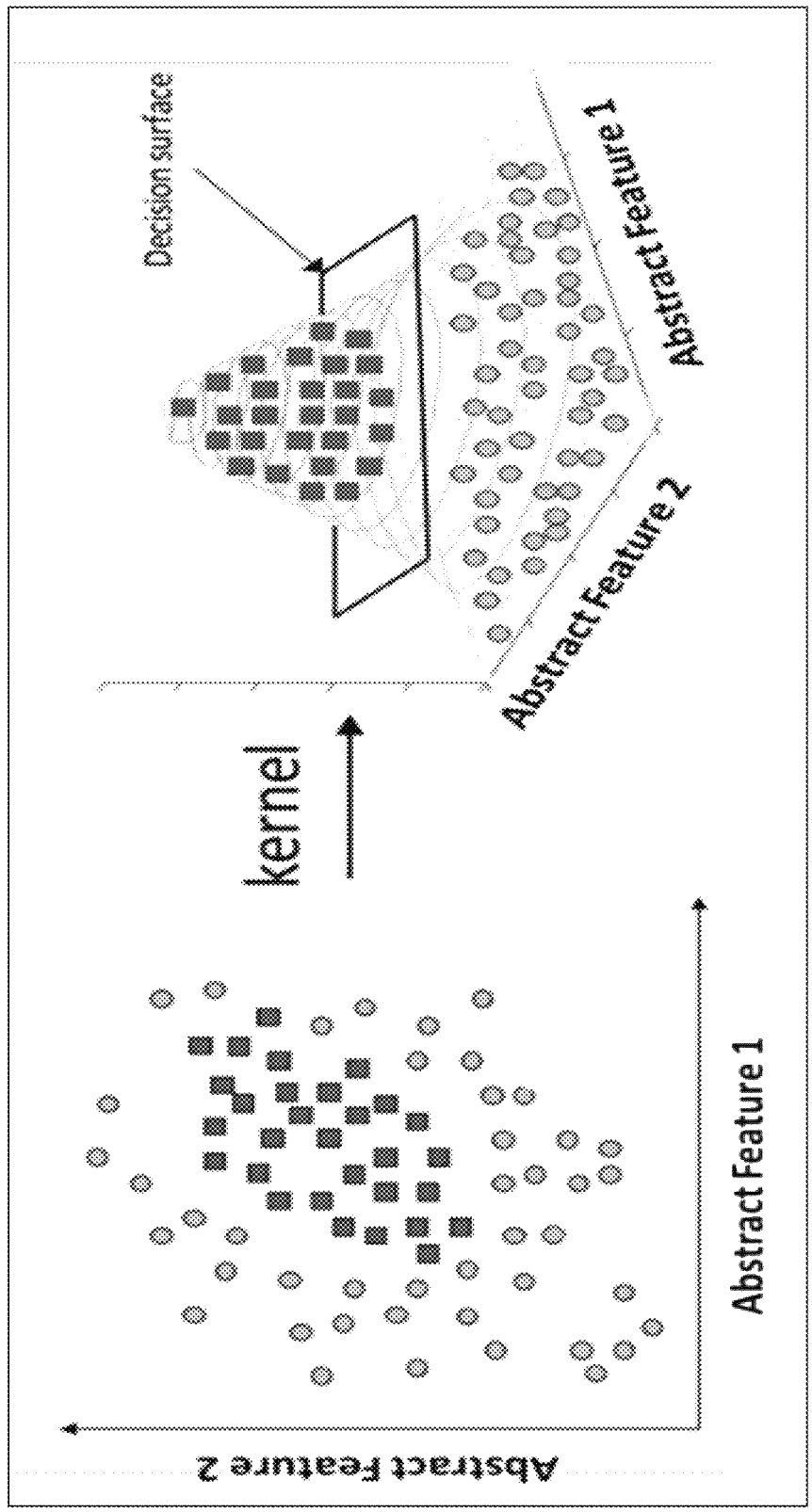
FIG. 12 illustrates application of a 2D kernel.

FIG. 12 illustrates application of a 2D kernel, depicting a decision surface of the developed kernel to identify RF emission signature features of interest.

Figure 13B:
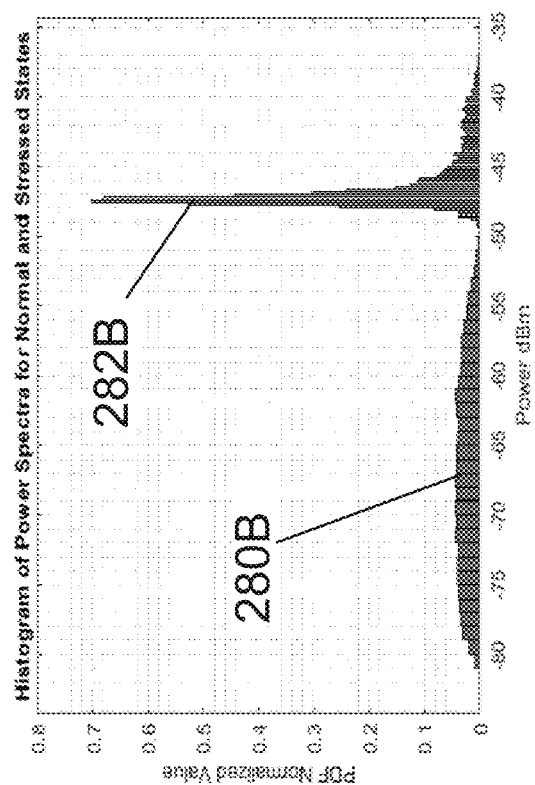
FIGS. 13A-13B illustrate histogram of the RF emission signal using PDF.
Figure 13A:
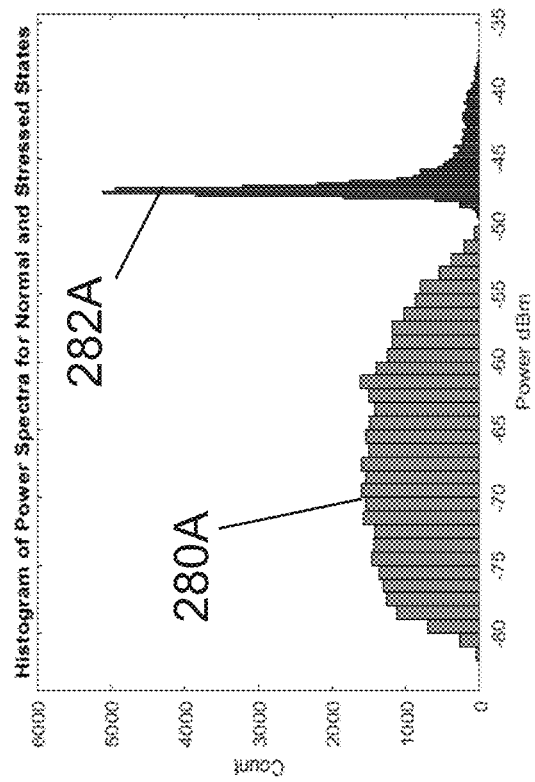

FIGS. 13A-13B illustrate histogram of the RF emission signal using PDF. FIG. 13A illustrates regular histograms. FIG. 13B illustrates normalized histograms. 280A and 280B represent a distribution of a stressed state. 282A and 282B represent a distribution of a normal state. Metrics, which present in the histograms show difference between the two distributions are mean, standard deviation. A clear difference between normal and stressed states in terms of the mean and deviation of the states can be seen.

Figure 14:
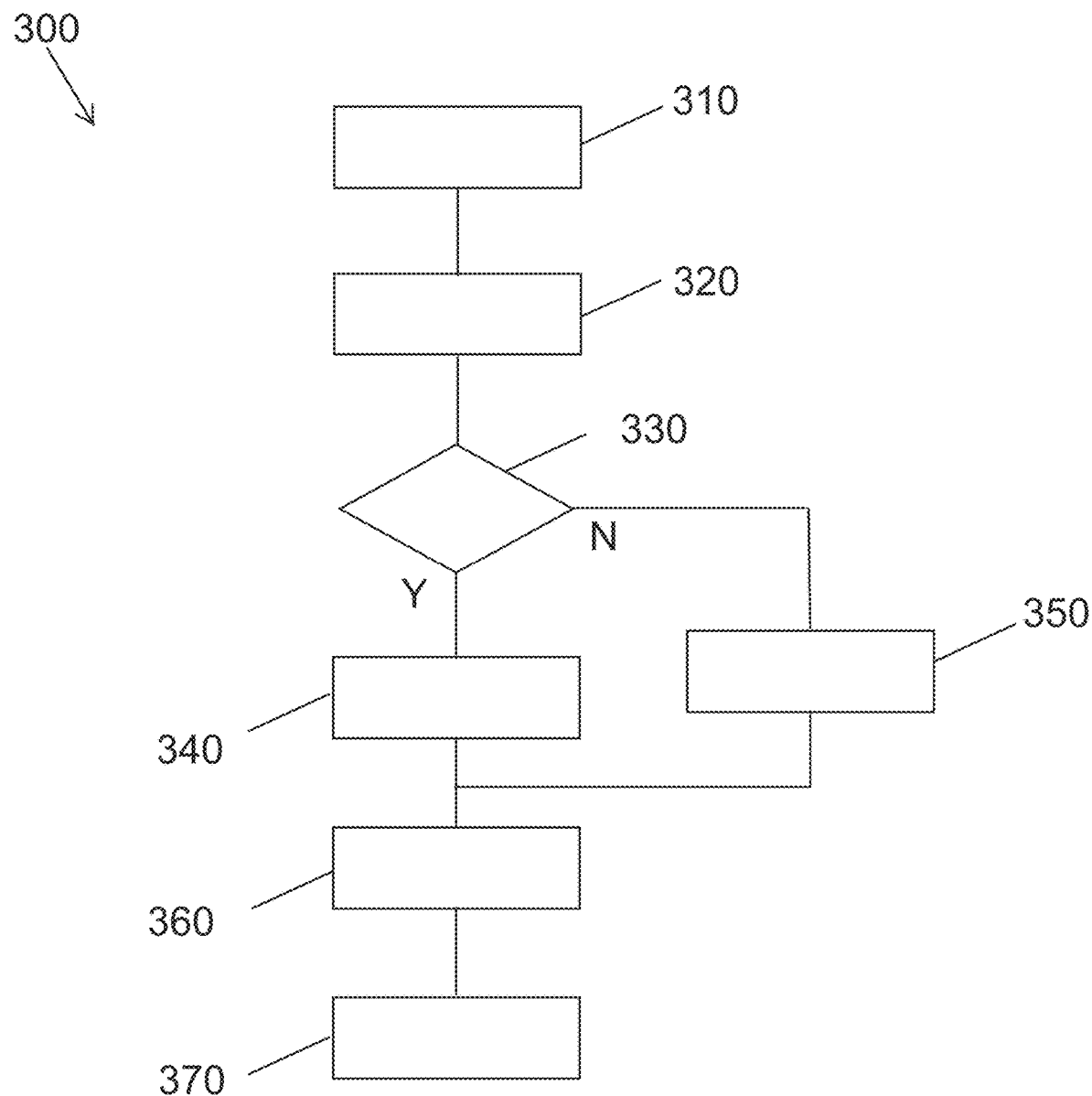
FIG. 14 illustrates a flow chart of an exemplary method to process received RF emission using a trained NN.

FIG. 14 illustrates a flow chart of an exemplary method 300 to process received RF emission signal using a trained NN. The RF emission signal is received by the antenna 20 and the receiver 30 at 310. A decision on selection of filtering approach may be made at 320. This decision may be made by measuring signal-to-noise (SNR) value at 320 by the controller 40. At 330, the controller 40 may be programmed to select SSA at 340 if the SNR value is negative or select wavelet transform at 350 if the SNR value is positive. PDF may be also used to determine RF emission signal SNR. This decision may be also made by using statistical methods. In an example a histogram may be used to determine a shape of the RF emission signature. If such shape depicts a pure Gaussian form (no skew), then the controller 40 may select SSA. If such shape depicts a skew, the controller 40 may select wavelet transform. Wavelet transform may result in a faster processing within the controller 40. The input data is the processed by the trained model within NN (within the controller 40) at 360. The controller 40 than outputs the results from NN at 370

The chosen exemplary embodiments of the claimed subject matter have been described and illustrated, to plan and/or cross section illustrations that are schematic illustrations of idealized embodiments, for practical purposes so as to enable any person skilled in the art to which it pertains to make and use the same. As such, variations from the shapes of the illustrations as a result, for example, of manufacturing techniques and/or tolerances, are to be expected. It is therefore intended that all matters in the foregoing description and shown in the accompanying drawings be interpreted as illustrative and not in a limiting sense. For example, a region illustrated or described as flat may, typically, have rough and/or nonlinear features. Moreover, sharp angles that are illustrated may be rounded and rounded angles may be sharp. Thus, the regions illustrated in the figures are schematic in nature and their shapes are not intended to illustrate the precise shape of a region and are not intended to limit the scope of the present claims. It will be understood that variations, modifications, equivalents and substitutions for components of the specifically described exemplary embodiments of the invention may be made by those skilled in the art without departing from the spirit and scope of the invention as set forth in the appended claims.

The Abstract is not intended to be limiting as to the scope of the claimed subject matter and is for the purpose of quickly determining the nature of the claimed subject matter.

What is claimed is:

1. A method, comprising:
   extracting, with a singular-spectrum analysis (SSA), components of a raw multi-component radio frequency (RF) emission signal from an electrical device, the electrical device having electrical power connected thereto; and
   determining, by applying extracted SSA components to a trained neural network (NN), a condition of the electrical device.

2. The method of claim 1, wherein extracting comprises:
   selecting a plurality of SSA components of the raw multi-component RF emission signal; and
   individually extracting each SSA component.

3. The method of claim 2, wherein determining comprises:
   individually inputting each extracted SSA component into the NN; and
   analyzing, with the NN, outputs from each inputted SSA component.

4. The method of claim 2, wherein determining comprises:
   combining two or more extracted SSA components; and
   inputting a combination of extracted SSA components into the NN; and
   analyzing, with the NN, an output from inputted combination.

5. The method of claim 1, wherein determining the condition comprises determining a remaining useful life (RUL) of the electrical device.

6. The method of claim 1, wherein determining the condition comprises determining a stress level of the electrical device.

7. The method of claim 1, further comprising measuring (SNR) of the multi-component RF emission signal prior to extracting the components.

8. The method of claim 1, further comprising, validating the condition of the electrical device by:
   decomposing, with a wavelet transform, components of the raw multi-component RF emission signal;
   determining, by applying decomposed components to the NN, another condition of the electrical device; and
   comparing the condition of the electrical device determined with the SSA with the another condition of the electrical device determined with the wavelet transform.

9. The method of claim 1, wherein extracting components of the raw multi-component radio frequency (RF) emission signal comprises extracting components of a raw multi-component radio frequency (RF) unintended emission signal.

10. The method of claim 1, wherein extracting comprises selecting a component of the raw multi-component RF emission signal based on a priori information.

11. A method, comprising:
    decomposing, with a wavelet transform, components of a raw multi-component radio frequency (RF) emission signal from an electrical device, the electrical device having electrical power connected thereto; and
    determining, by applying decomposed components to a trained neural network (NN), a condition of the electrical device.

12. The method of claim 11, further comprising, validating the condition of the electrical device by:
    extracting, with a singular-spectrum analysis (SSA), the components of the raw multi-component RF emission signal;
    determining, by applying extracted SSA components to the NN, another condition of the electrical device; and
    comparing the condition of the electrical device determined with the wavelet transform with the another condition of the electrical device determined with the SSA.

13. The method of claim 11, wherein decomposing the components of a raw multi-component radio frequency (RF) emission signal comprises decomposing components of a raw multi-component radio frequency (RF) unintended emission signal.

14. The method of claim 11, wherein decomposing further comprises identification of a resolution level to isolate an RF signal source.

15. A sensor, comprising:
    an antenna, the antenna is designed and mounted to capture an unintended emission of electromagnetic energy in a radio frequency (RF) range of a spectra from a powered electrical device;
    a receiver electrically coupled to the antenna, the receiver designed to receive captured RF emission signal and convert the captured RF emission signal into a data set in a digital format, the data set describing a signature of an RF emission from an electrical device; and
    a controller electrically coupled to the receiver, the controller includes at least one or more processors and a machine-readable storage medium including instructions that when executed by one or more processors, cause the controller to perform operations comprising:
    receive the data set,
    apply a statistical method to classify the data set prior to filtering the data set,
    select one of a singular-spectrum analysis (SSA) and a wavelet transform to filter the data set,
    filter the data set to reduce a complexity of the data set,
    input filtered data set into a trained model of a neural network,
    process inputted filtered data set with the trained model, and
    output a condition of the electrical device.

16. The sensor of claim 15, wherein the controller being further programmed to calculate a signal to noise ratio (SNR).

17. The sensor of claim 15, wherein the condition comprises a remaining useful life (RUL) of the electrical device.

18. The sensor of claim 15, wherein the condition comprises a stress level of the electrical device.

19. The sensor of claim 15, further comprising selecting, with the controller, the SSA in a response to received RF emission signal being contained within a noise floor.

20. The sensor of claim 15, further comprising measuring, with the controller, a signal to noise ratio (SNR) of a received RF emission signal prior to filtering the data set.

21. A method, comprising:
    extracting, with a singular-spectrum analysis (SSA), components of a raw multi-component radio frequency (RF) emission signal from an electrical device, the electrical device having electrical power connected thereto;
    determining, by applying extracted components to a trained neural network (NN), a condition of the electrical device; and validating, with a Mahalanobis distance matric, the components extracted with SSA.

\* \* \* \* \*